US008908434B2

(12) United States Patent
Lin et al.

(10) Patent No.: US 8,908,434 B2
(45) Date of Patent: Dec. 9, 2014

(54) OPERATING METHODS OF FLASH MEMORY AND DECODING CIRCUITS THEREOF

(75) Inventors: Yvonne Lin, Saratoga, CA (US); Tien-Chun Yang, San Jose, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 400 days.

(21) Appl. No.: 13/021,381

(22) Filed: Feb. 4, 2011

(65) Prior Publication Data

US 2012/0201084 A1    Aug. 9, 2012

(51) Int. Cl.
*G11C 16/00* (2006.01)
*G11C 16/14* (2006.01)
*G11C 16/12* (2006.01)
*H01L 27/15* (2006.01)
*G11C 16/04* (2006.01)
*G11C 16/32* (2006.01)

(52) U.S. Cl.
CPC .............. *G11C 16/14* (2013.01); *G11C 16/12* (2013.01); *H01L 27/15* (2013.01); *G11C 16/0408* (2013.01); *G11C 16/32* (2013.01)
USPC ............ 365/185.14; 365/185.18; 365/185.23; 365/185.29

(58) Field of Classification Search
CPC ........ G11C 16/00; G11C 16/10; G11C 16/30; G11C 16/12; H01L 27/15
USPC ............ 365/185.14, 185.18, 185.23, 185.29, 365/218
See application file for complete search history.

(56) References Cited

U.S. PATENT DOCUMENTS

| 5,252,847 | A | * | 10/1993 | Arima et al. | 257/320 |
|---|---|---|---|---|---|
| 5,455,792 | A | * | 10/1995 | Yi | 365/185.15 |
| 2004/0000688 | A1 | * | 1/2004 | Harari et al. | 257/315 |
| 2004/0065917 | A1 | * | 4/2004 | Fan et al. | 257/315 |
| 2004/0125651 | A1 | * | 7/2004 | Toda | 365/185.03 |
| 2004/0256657 | A1 | * | 12/2004 | Hung et al. | 257/315 |
| 2005/0023598 | A1 | * | 2/2005 | Furuhata | 257/315 |
| 2009/0154246 | A1 | * | 6/2009 | Liu et al. | 365/185.15 |
| 2012/0087188 | A1 | * | 4/2012 | Hsieh et al. | 365/185.05 |
| 2013/0023114 | A1 | * | 1/2013 | Power | 438/585 |

* cited by examiner

*Primary Examiner* — Douglas King
(74) *Attorney, Agent, or Firm* — Lowe Hauptman & Ham, LLP

(57) ABSTRACT

A FLASH memory cell includes a control gate over a floating gate over a substrate. A wall line and an erase gate each is disposed adjacent to a respective sidewall of the control gate. A first source/drain (S/D) region is disposed in the substrate and adjacent to a sidewall of the wall line. A second S/D region is disposed in the substrate and adjacent to the sidewall of the floating gate. A method of operating the FLASH memory cell includes applying a first voltage level to the control gate. A second voltage level is applied to the word line. The second voltage level is lower than the first voltage level. A third voltage level is applied to the first S/D region. A fourth voltage level is applied to the second S/D region. The fourth voltage level is higher than the third voltage level. The erase gate is electrically floating.

20 Claims, 6 Drawing Sheets

OPERATING METHODS OF FLASH MEMORY AND DECODING CIRCUITS THEREOF

TECHNICAL FIELD

The present disclosure relates generally to the field of semiconductor devices, and more particularly, to operating methods of FLASH memory and decoding circuits thereof.

BACKGROUND

The market share of complementary metal-oxide-semiconductor (CMOS) memory devices has been continuously growing, especially in view of the development of FLASH memory in which a single cell can be electrically programmable and a block, sector or page of the cells may be simultaneously electrically erasable. In recent years, the FLASH memory has found interesting applications in consumer products such as digital cameras, digital video cameras, cellular telephones, laptop computers, and personal digital assistants. Because portability of the consumer products is often a prerequisite by consumers, a reduction in the size of the consumer products continues to be a hot button. As a result, the functionality and capacity of the FLASH memory should be augmented, while, at the same time, maintaining or, preferably, reducing the footprint of the FLASH memory.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION

Figure 1:
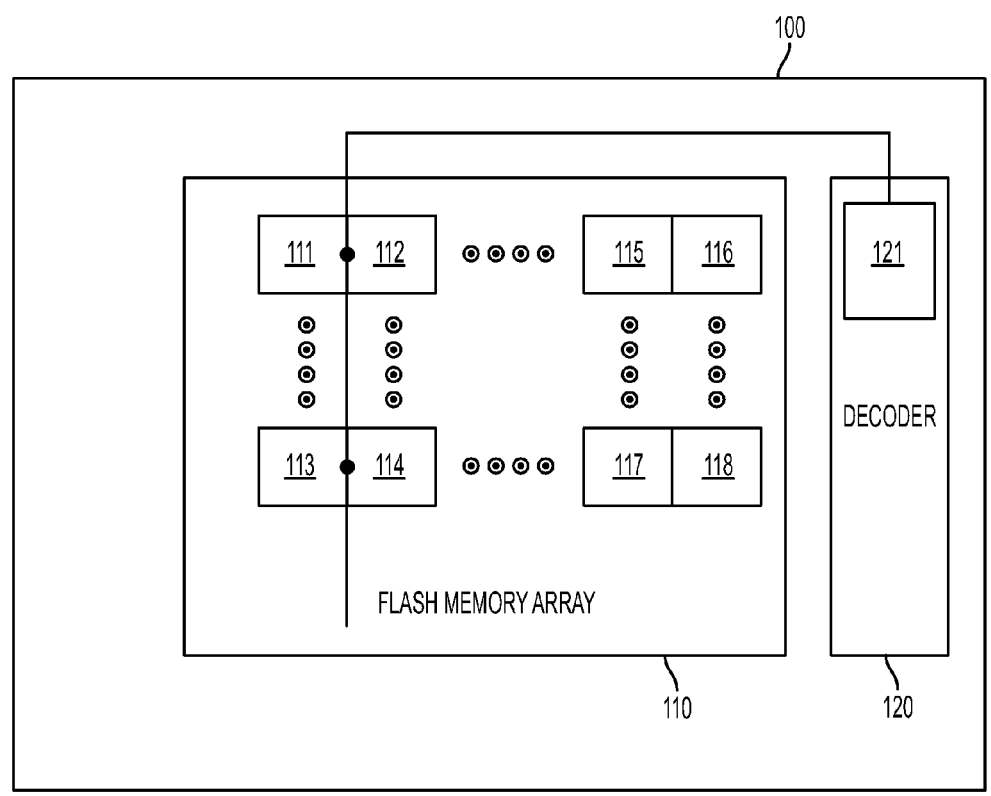
FIG. 1 is a schematic drawing illustrating an exemplary FLASH memory circuit.

Currently, FLASH memory, such as a split gate FLASH memory is widely applied in large capacity non-volatile memory technology. Typically, the split gate FLASH memory has an erase gate. The erase gate is electrically coupled to a decoding circuit. Depending on programming, reading, or erasing the selected FLASH memory cell, the decoding circuit provides different voltage levels to the erase gate. Generally, the decoding circuit provides a fixed voltage level, for example, 5 V, 0 V and 13 V to the erase gate of the selected FLASH memory cell for programming, reading and erasing the selected FLASH memory cell, respectively. Usually, erase gates of unselected FLASH memory cells may receive voltages at the same level as the erase gate of the elected FLASH memory cell during programming, reading and erasing.

It is found that if the fixed voltage level, e.g., 5 V, is applied to the erase gates of the unselected FLASH memory cell during the programming period of the selected FLASH memory cell, the unselected FLASH memory cells may be subjected to punch-through disturbs, erase and/or reverse tunneling. It is also found that in order to provide the fixed voltage levels to the erase gate of the selected FLASH memory cell, the decoding circuit is complex and takes more areas.

It is understood that the following descriptions provide many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Illustrated in FIG. 1 is a schematic drawing showing an exemplary FLASH memory circuit. In FIG. 1, a FLASH memory circuit 100 can include at least one FLASH memory array, e.g., a FLASH memory array 110, which is electrically coupled with a decoder 120. The FLASH memory array 110 can include a plurality of FLASH memory cells, e.g., FLASH memory cells 111-118, which are configured to store data. In some embodiments, the FLASH memory cells 111 and 113 can share the same word line. The FLASH memory cells 112 and 114 can share the same word line. The FLASH memory cells 115 and 117 can share the same word line. The FLASH memory cells 116 and 118 can share the same word line.

In FIG. 1, the decoder 120 can be configured to decode the data stored in the FLASH memory cells 111-118 during read, write and/or erase periods. In some embodiments, the decoder 120 can include an erase gate decoding circuit 121. The erase gate decoding circuit 121 can be electrically coupled with the FLASH memory cells 111-114. In other embodiments, the erase gate decoding circuit 121 can be electrically coupled with the FLASH memory cells 111-118. The erase gate decoding circuit 121 can be configured to electrically float, for example, an erase gate of the FLASH memory cell 111, while the FLASH memory cell 111 is programmed.

Figure 2:
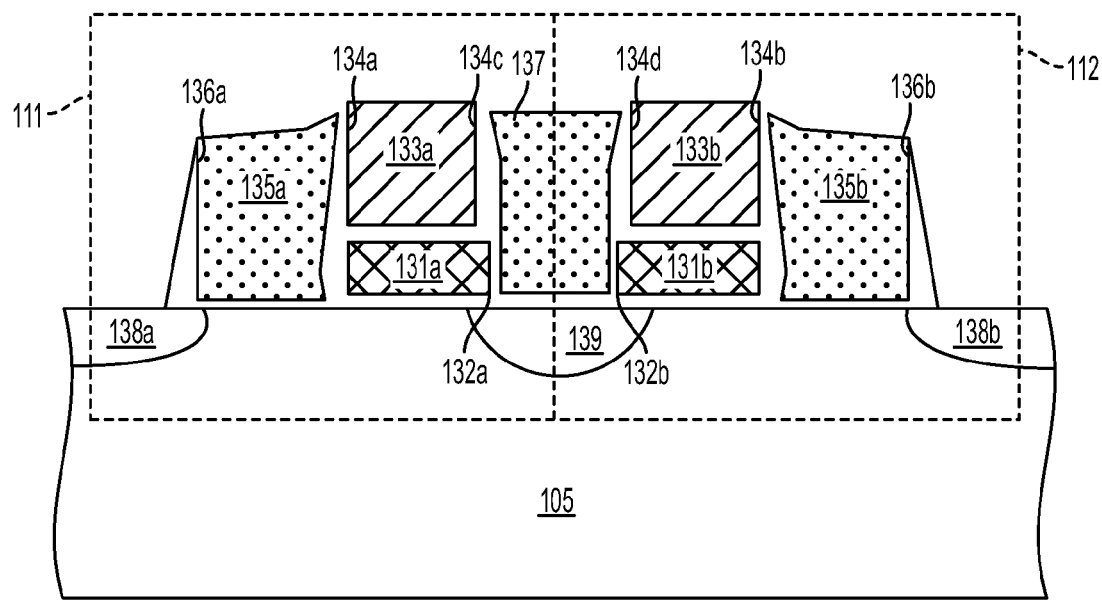
FIG. 2 is a schematic cross-sectional view of exemplary FLASH memory cells.

FIG. 2 is a schematic cross-sectional view of exemplary FLASH memory cells. In FIG. 2, the FLASH memory cells 111 and 112 can include floating gates 131a and 131b, respectively, over a substrate 105. The substrate 105 can be a silicon substrate doped with a P-type dopant, such as boron (a P-type substrate). Alternatively, the substrate 105 could be another suitable semiconductor material. For example, the substrate 105 may be a silicon substrate that is doped with an N-type dopant, such as phosphorous or arsenic (an N-type substrate). The substrate 105 may alternatively be made of some other suitable elementary semiconductor, such as diamond or germanium; a suitable compound semiconductor, such as silicon carbide, silicon germanium, indium arsenide, or indium phosphide; or a suitable alloy semiconductor, such as silicon germanium carbide, gallium arsenic phosphide, or gallium indium phosphide. Further, the substrate 105 could include an epitaxial layer (epi layer), may be strained for performance enhancement, and may include a silicon-on-insulator (SOI) structure.

Referring to FIG. 2, the FLASH memory cells 111 and 112 can include control gates 133a and 133b that are disposed over the floating gates 131a and 131b, respectively. Wall lines 135a and 135b can be disposed adjacent to sidewalls 134a and 134b of control gates 133a and 133b, respectively. An erase gate 137 can be disposed adjacent to sidewalls 134c and 134d of the control gates 133a and 133b, respectively. In some embodiments, the erase gate 137 can be referred to as a common erase gate. Source/drain (S/D) regions 138a and 138b can be disposed in the substrate 105 and adjacent to sidewalls 136a and 136b of wall lines 135a and 134b, respectively. In some embodiments, the S/D regions 138a and 138b can be referred to as bit lines. An S/D region 139 can be disposed in the substrate 105 and adjacent to sidewalls 132a and 132b of the floating gates 131a and 131b, respectively. In some embodiments, the S/D region 139 can be referred to as a common S/D region.

In some embodiments, an oxide/nitride/oxide (ONO) structure can be disposed between the floating gate 131a and the control gate 133a, between the wall line 135a and the control gate 133a, and between the erase gate 137 and the control gate 133a. In other embodiments, an oxide between the floating gate 131a and the substrate 105 can be thicker than that between the wall line 135a and the substrate 105.

In some embodiments programming the FLASH memory cell 111, a voltage level $V_{C1}$ can be applied to the control gate 133a. A voltage level $V_{W1}$ can be applied to the wall line 135a. The voltage level $V_{W1}$ is lower than the voltage level $V_{C1}$. A voltage level $V_{BL1}$ can be applied to the S/D region 138a. A voltage level $V_{CS1}$ can be applied to the S/D region 139. The voltage level $V_{CS1}$ is higher than the voltage level $V_{BL1}$. The erase gate 137 is electrically floating. In some embodiments in which the FLASH memory cells 112-118 are not selected, the erase gates of the FLASH memory cells 112-118 (shown in FIG. 1) can be electrically floating during the programming period of the FLASH memory cell 111. In other embodiments, before electrically floating the erase gate 137, a voltage level of the erase gate 137 is pulled down toward ground or 0 V.

It is noted that while programming the FLASH memory cell 111, the erase gates of the unselected FLASH memory cells 112-118 are electrically floating. For example, no substantial coupling effect is applied from the erase gate 137 to the floating gate 131b. A punch-through disturb may be substantially reduced. It is also noted that the erase gates of the unselected FLASH memory cells 113-118 (shown in FIG. 1) are electrically floating during the programming period of the FLASH memory cell. Possible erase and/or reverse tunneling to at least one of the unselected FLASH memory cells 113-118 can be desirably reduced.

In some embodiments programming the FLASH memory cell 111, the voltage level $V_{CS1}$ is higher than the voltage level $V_{W1}$ and lower than the voltage level $V_{C1}$. In other embodiments programming the FLASH memory cell 111, the voltage level $V_{BL1}$ is lower than the voltage level $V_{W1}$. In still other embodiments programming the FLASH memory cell 111, the voltage level $V_{W1}$ can be about 1.3±0.1 V, the voltage level $V_{BL1}$ can be around 0.8 V±0.1, the voltage level $V_{C1}$ can be around 12±1.2 V, and the voltage level $V_{CS1}$ can be around 5±0.5 V. In yet still other embodiments programming the FLASH memory cell 111, the voltage level $V_{W1}$ can be about 1.3±0.1 V, the voltage level $V_{BL1}$ can be around 0.8 V, the voltage level $V_{C1}$ can be around 12 V, and the voltage level $V_{CS1}$ can be around 5 V. It is noted that the voltage levels described above are merely exemplary. Different voltage levels can be applied to the FLASH memory cells depending on, for example, technology nodes.

In some embodiments reading the FLASH memory cell 111, a voltage level $V_{C2}$ can be applied to the control gate 133a. A voltage level $V_{W2}$ can be applied to the wall line 135a. A voltage level $V_{BL2}$ can be applied to the S/D region 138a. A voltage level $V_{CS2}$ can be applied to the S/D region 139. The erase gate 137 is electrically floating. In other embodiments, the erase gates of the FLASH memory cells 112-118 (shown in FIG. 1) are electrically floating during the read period of the FLASH memory cell 111.

It is noted that the erase gate 137 of the FLASH memory cell 111 is electrically floating while the FLASH memory cell 111 is read. The coupling ratio from the control gate 133a to the floating gate 131a may be enhanced. The read current of the FLASH memory cell 111 may be increased.

In some embodiments reading the FLASH memory cell 111, the voltage level $V_{C2}$ is substantially equal to the voltage level $V_{W2}$. The voltage level $V_{BL2}$ is higher than the voltage level $V_{CS2}$. In other embodiments, the voltage level $V_{C2}$ is higher than the voltage level $V_{BL2}$. In still other embodiments reading the FLASH memory cell 111, the voltage level $V_{W2}$ can be about 2.5±0.25 V, the voltage level $V_{BL2}$ can be around 0.8±0.08 V, the voltage level $V_{C2}$ can be around 2.5±0.25 V, and the voltage level $V_{CS2}$ can be around 0 V. In yet still other embodiments reading the FLASH memory cell 111, the voltage level $V_{W2}$ can be about 2.5±0.1 V, the voltage level $V_{BL2}$ can be around 0.8 V, the voltage level $V_{C2}$ can be around 2.5±0.1 V, and the voltage level $V_{CS2}$ can be around 0 V. It is noted that the voltage levels described above are merely exemplary. Different voltage levels can be applied to the FLASH memory cells depending on, for example, technology nodes.

In some embodiments erasing the FLASH memory cell 111, a voltage level $V_{C3}$ can be applied to the control gate 133a. A voltage level $V_{W3}$ can be applied to the wall line 135a. A voltage level $V_{BL3}$ can be applied to the S/D region 138a. A voltage level $V_{CS3}$ can be applied to the S/D region 139. A voltage level $V_E$ can be applied to the erase gate 137. In some embodiments erasing the FLASH memory cell 111, the voltage level $V_E$ is higher than each of the voltage levels $V_{C3}$, $V_{W3}$, $V_{BL3}$ and $V_{CS3}$. In other embodiments erasing the FLASH memory cell 111, the voltage level $V_{WL3}$ can be about 0 V, the voltage level $V_{BL3}$ can be about 0 V, the voltage level $V_{C3}$ can be around 0 V, the voltage level $V_{CS3}$ can be around 0 V, and the voltage level $V_E$ can be around 12.5±1.25 V. In still other embodiments erasing the FLASH memory cell 111, the voltage level $V_{WL3}$ can be about 0 V, the voltage level $V_{BL3}$ can be about 0 V, the voltage level $V_{C3}$ can be around 0 V, the voltage level $V_{CS3}$ can be around 0 V, and the voltage level $V_E$ can be around 12.5 V. It is noted that the voltage levels described above are merely exemplary. Different voltage levels can be applied to the FLASH memory cells depending on, for example, technology nodes.

Figure 3:
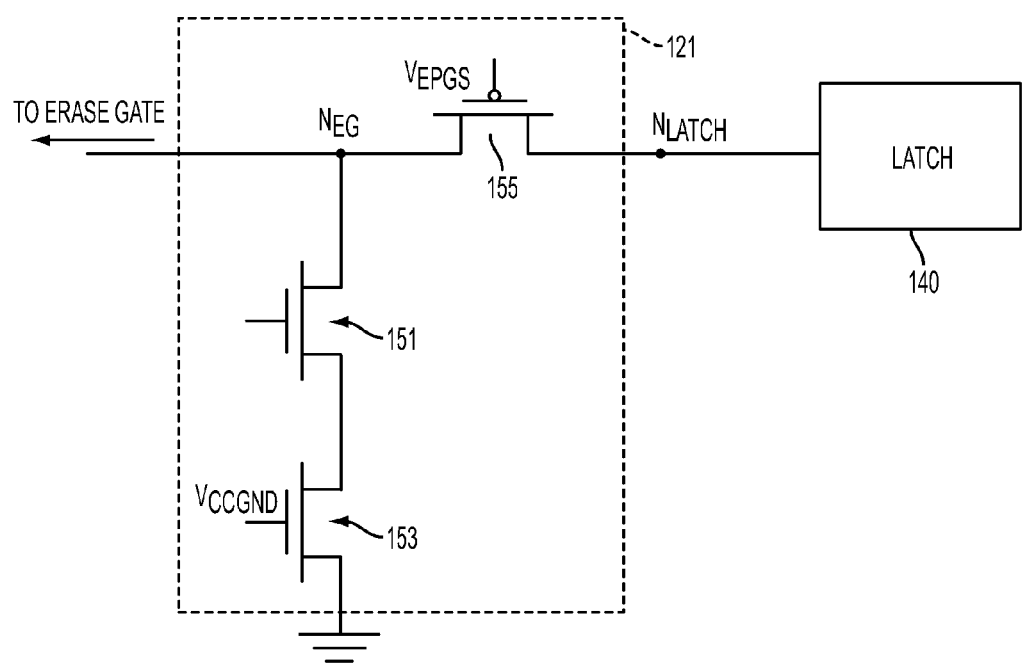
FIG. 3 is a schematic drawing illustrating an exemplary erase gate decoding circuit.

FIG. 3 is a schematic drawing illustrating an exemplary erase gate decoding circuit. In FIG. 3, the erase gate decoding circuit 121 can be electrically coupled between the erase gate 137 of the FLASH memory cell 111 (shown in FIG. 2) and a latch 140. In some embodiments, the erase gate decoding circuit 121 can include a cascode transistor 151, a ground transistor 153, and a switch 155. In some embodiments, the cascode transistor 151 can be a high-voltage N-type transistor. The ground transistor 153 can be a normal-voltage N-type transistor. The switch 155 can include a P-type transistor. It is noted that the types of the transistors 151, 153 and/or the switch 155 described above are merely exemplary. The type of transistors may be modified.

In some embodiments, the erase gate decoding circuit 121 can essentially consist of the cascode transistor 151, the ground transistor 153, and the switch 155. In other embodiments, the term "essentially consist of" can mean that the erase gate decoding circuit 121 can include passive elements, e.g., resistors, except the cascode transistor 151, the ground transistor 153, and the switch 155. In still other embodiments, the term "essentially consist of" can mean that the erase gate decoding circuit 121 can be free from including circuits and/or transistors that may be configured to assist the erase gate decoding circuit 121 to provide a fixed voltage level, e.g., 0 V or 5 V, during a read period and/or an erase period. Because the erase gate circuit 121 can be free from including the circuits and/or transistors, the area of the erase gate circuit 121 can be reduced, for example, by around 20%.

Referring to FIG. 3, the cascode transistor 151 can be electrically coupled with the erase gate 137 of the FLASH memory cell 111. In some embodiments, the cascode transistor 151 is configured to protect the ground transistor 153, such that the ground transistor 153 does not see a high voltage level on a node $N_{EG}$ (shown in FIG. 3). The ground transistor 153 can be electrically coupled between the cascode transistor 151 and ground. The switch 155 can be electrically coupled between the erase gate 137 of the FLASH memory cell 111 and the latch 140.

Figure 4:
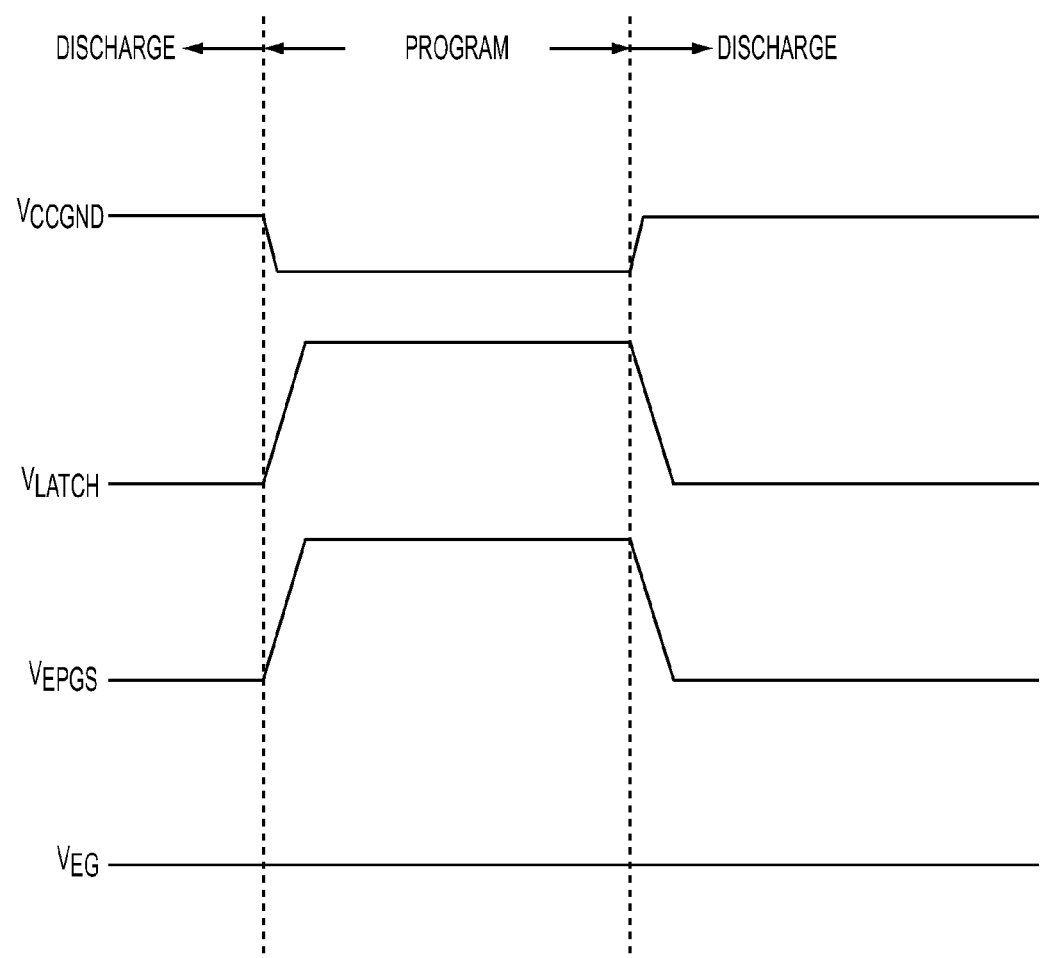
FIG. 4 is a schematic drawing illustrating voltage waveforms applied to the erase gate decoding circuit for programming a FLASH memory cell.

FIG. 4 is a schematic drawing illustrating voltage waveforms applied to the erase gate decoding circuit shown in FIG. 3 for programming a FLASH memory cell. Referring to FIGS. 3 and 4, a voltage $V_{EG}$ can be applied to the node $N_{EG}$, a voltage $V_{LATCH}$ can be applied to a node $N_{LATCH}$, a voltage $V_{CCGND}$ can be applied to a gate of the ground transistor 153 and a voltage $V_{EPGS}$ can be applied to a gate of the switch 155.

Referring to FIG. 4, in some embodiments a discharge is performed for a period before a program period. During the discharge period, the cascode transistor 151 can be turned on. The voltages $V_{LATCH}$, $V_{EPGS}$ and $V_{EG}$ can stay at a low voltage state, such that the switch 155 is turned off. The switch 155 is configured to electrically isolate the latch 140 and the erase gate 137 of the FLASH memory cell 131 (shown in FIG. 2). The voltage $V_{CCGND}$ can stay at a high voltage state to turn on the ground transistor 153. Because the switch 155 is turned off and the ground transistor 153 is turned on, the voltage level on the node $N_{EG}$ can be pulled down toward ground or 0 V.

In some embodiments, the low voltage state of the voltages $V_{LATCH}$ and $V_{EPGS}$ can have a voltage level of around 1.8 V. The low voltage state of the voltage $V_{EG}$ can have a voltage level of around 0 V. It is noted that the voltage levels described above are merely exemplary. The voltage levels can be modified by, for example, changes of transistors and/or switch of the erase gate decoding circuit 121.

In some embodiments for programming the FLASH memory cell 111 (shown in FIG. 2), the cascode transistor 151 can be turned on. The voltages $V_{LATCH}$ and $V_{EPGS}$ can transition from a low voltage state to a high voltage state, e.g., around 11 V, to turn off the switch 155. Because the voltage level on the node $N_{EG}$ is pulled down toward ground, the voltage state on the node $N_{EG}$ stays low. The voltage $V_{CCGND}$ can transition from a high voltage state to a low voltage state, e.g., 0 V, to turn off the ground transistor 153, such that the erase gate 137 of the FLASH memory cell 111 is electrically floating.

Figure 5:
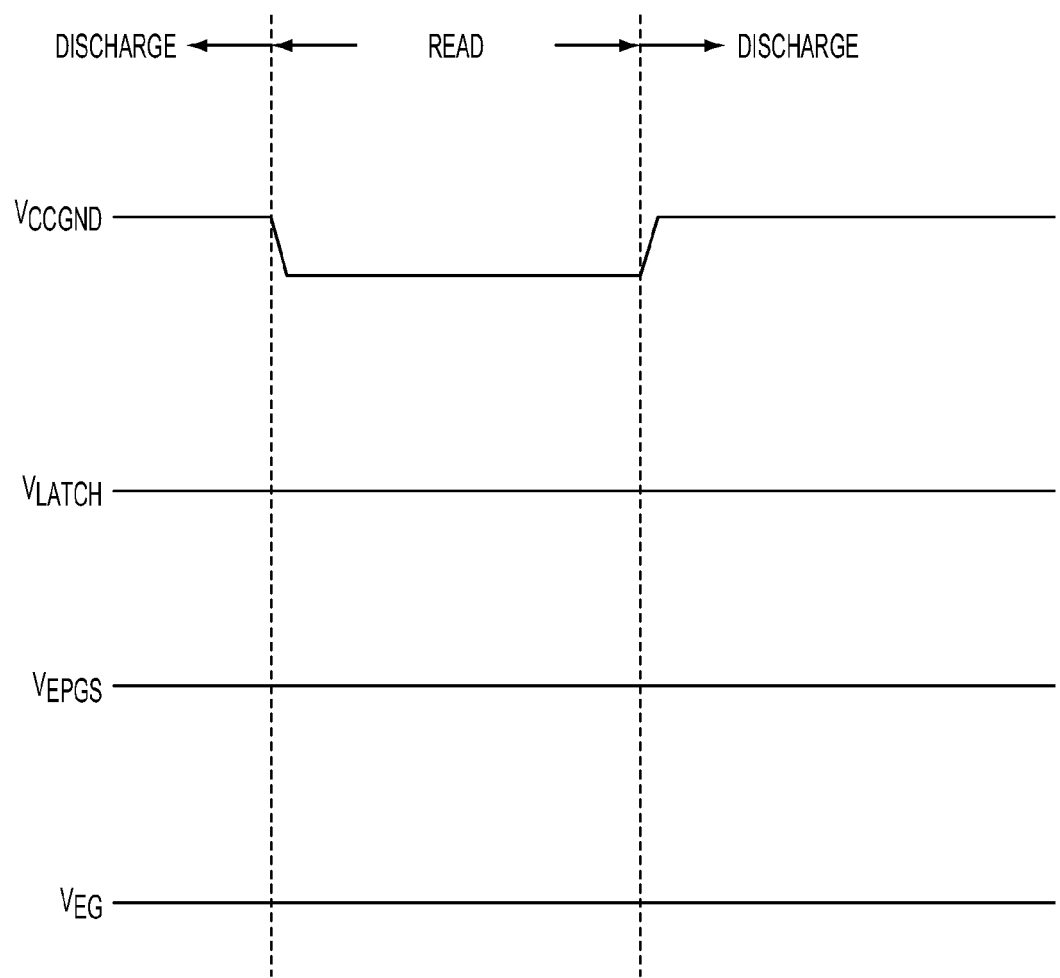
FIG. 5 is a schematic drawing illustrating voltage waveforms applied to the erase gate decoding circuit for reading a FLASH memory cell.

FIG. 5 is a schematic drawing illustrating voltage waveforms applied to the erase gate decoding circuit shown in FIG. 3 for reading a FLASH memory cell. Referring to FIG. 5, in some embodiments a discharge period is performed before a read period. During the discharge period, the cascode transistor 151 can be turned on. The voltages $V_{LATCH}$, $V_{EPGS}$ and $V_{EG}$ can stay at a low voltage state, such that the switch 155 is turned off. The switch 155 is configured to electrically isolate the latch 140 and the erase gate 137 of the FLASH memory cell 131 (shown in FIG. 2). The voltage $V_{CCGND}$ can stay at a high voltage state to turn on the ground transistor 153. Because the switch 155 is turned off and the ground transistor 153 is turned on, the voltage level on the node $N_{EG}$ can be pulled down toward ground or 0 V.

In some embodiments, the low voltage state of the voltages $V_{LATCH}$ and $V_{EPGS}$ can have a voltage level of around 1.8 V. The low voltage state of the voltage $V_{EG}$ can have a voltage level of around 0 V. It is noted that the voltage levels described above are merely exemplary. The voltage levels can be modified by, for example, changes of transistors and/or switch of the erase gate decoding circuit 121.

In some embodiments for reading the FLASH memory cell 111 (shown in FIG. 2), the cascode transistor 151 can be turned on. The voltages $V_{LATCH}$ and $V_{EPGS}$ can stay at the low voltage state to turn off the switch 155. Because the voltage level on the node $N_{EG}$ is pulled down toward ground, the voltage state on the node $N_{EG}$ stays low. The voltage $V_{CCGND}$ can transition from a high voltage state to a low voltage state, e.g., 0 V, to turn off the ground transistor 153, such that the erase gate 137 of the FLASH memory cell 111 is electrically floating.

Figure 6:
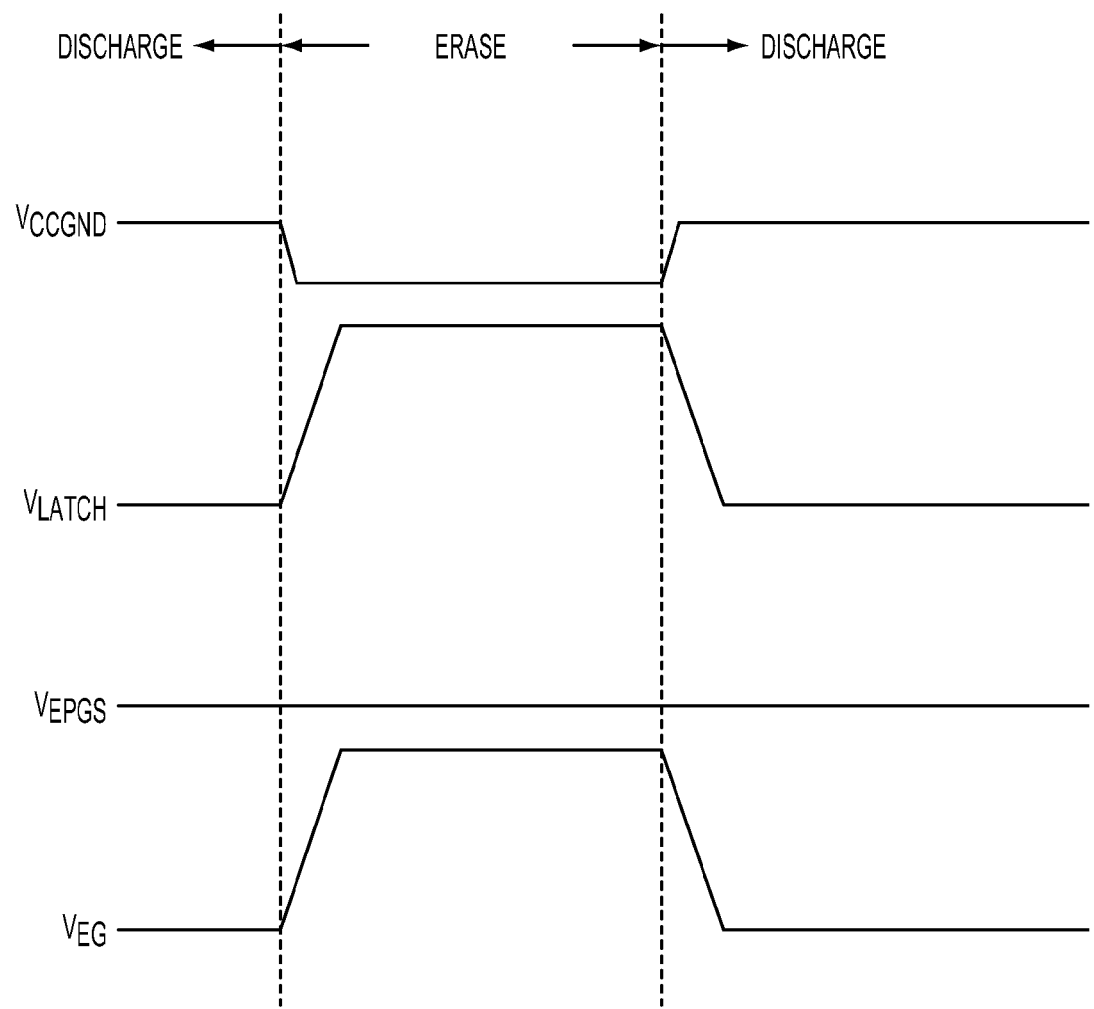
FIG. 6 is a schematic drawing illustrating voltage waveforms applied to the erase gate decoding circuit for erasing a FLASH memory cell.

FIG. 6 is a schematic drawing illustrating voltage waveforms applied to the erase gate decoding circuit shown in FIG. 3 for erasing a FLASH memory cell. Referring to FIG. 6, in some embodiments a discharge period is performed before an erase period. During the discharge period, the cascode transistor 151 can be turned on. The voltages $V_{LATCH}$, $V_{EPGS}$ and $V_{EG}$ can stay at a low voltage state, such that the switch 155 is turned off. The switch 155 is configured to electrically isolate the latch 140 and the erase gate 137 of the FLASH memory cell 131 (shown in FIG. 2). The voltage $V_{CCGND}$ can stay at a high voltage state to turn on the ground transistor 153. Because the switch 155 is turned off and the ground transistor 153 is turned on, the voltage level on the node $N_{EG}$ can be pulled down toward ground or 0 V.

In some embodiments, the low voltage state of the voltages $V_{LATCH}$ and $V_{EPGS}$ can have a voltage level of around 1.8 V. The low voltage state of the voltage $V_{EG}$ can have a voltage level of around 0 V. It is noted that the voltage levels described above are merely exemplary. The voltage levels can be modified by, for example, changes of transistors and/or switch of the erase gate decoding circuit 121.

In some embodiments for erasing the FLASH memory cell 111 (shown in FIG. 2), the cascode transistor 151 can be turned on. The switch 155 can include a P-type transistor. The voltage $V_{LATCH}$ can transition from a low voltage state to a high voltage state, e.g., 13 V. The voltage $V_{EPGS}$ can stay at the low voltage state. Due to the voltage state difference, the P-type transistor of the switch 155 is turned on, such that the voltage $V_{EPGS}$ can be electrically coupled to the node $N_{EG}$. Because the voltage state of the node $N_{EG}$ is already pulled to a low voltage state during the discharge period, the electrical coupling of the voltage $V_{EPGS}$ to the node $N_{EG}$ can have the voltage $V_{EG}$ transitioning from the low voltage state to a high voltage state, e.g., 13 V. The voltage $V_{CCGND}$ can transition from a high voltage state to a low voltage state, e.g., 0 V, to turn off the ground transistor 153, such that the high voltage state on the node $N_{EG}$ can be applied to the erase gate 137 of the FLASH memory cell 111 (shown in FIG. 2) for erasing the FLASH memory cell 111.

In an embodiment of the current application, a method of operating a FLASH memory cell is provided. The FLASH memory cell comprises a floating gate being disposed over a substrate. A control gate is disposed over the floating gate. A wall line is disposed adjacent to a first sidewall of the control gate. An erase gate is disposed adjacent to a second sidewall of the control gate. A first source/drain (S/D) region is disposed in the substrate and adjacent to a sidewall of the wall line. A second S/D region is disposed in the substrate and adjacent to a sidewall of the floating gate. The method comprises applying a first voltage level to the control gate. A second voltage level is applied to the wall line. The second voltage level is lower than the first voltage level. A third voltage level is applied to the first S/D region. A fourth voltage level is applied to the second S/D region. The fourth voltage level is higher than the third voltage level. The erase gate is electrically floating.

In another embodiment of the current application, a FLASH memory circuit comprises at least one FLASH memory array including a plurality of FLASH memory cells. The FLASH memory cells comprise a first FLASH memory cell comprising a floating gate being disposed over a substrate. A control gate is disposed over the floating gate. A wall line is disposed adjacent to a first sidewall of the control gate. An erase gate is disposed adjacent to a second sidewall of the control gate. A first source/drain (S/D) region is disposed in the substrate and adjacent to a sidewall of the wall line. A second S/D region is disposed in the substrate and adjacent to a sidewall of the floating gate. An erase gate decoding circuit is electrically coupled with the first FLASH memory cell. The erase gate decoding circuit is configured to electrically float the erase gate while the first FLASH memory cell is programmed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of operating a FLASH memory cell, the FLASH memory cell comprising a floating gate being disposed over a substrate, a control gate being disposed over the floating gate, a wall line being disposed adjacent to a first sidewall of the control gate, an erase gate being disposed adjacent to a second sidewall of the control gate, a first source/drain (S/D) region being disposed in the substrate and adjacent to a sidewall of the wall line, and a second S/D region being disposed in the substrate and adjacent to a sidewall of the floating gate, the method comprising:
    applying a first voltage level to the control gate;
    applying a second voltage level to the wall line, wherein the second voltage level is lower than the first voltage level;
    applying a third voltage level to the first S/D region, wherein the third voltage is greater than a ground voltage;
    applying a fourth voltage level to the second S/D region, wherein the fourth voltage level is higher than the third voltage level; and
    electrically floating the erase gate using an erase gate decoding circuit, the erase gate decoding circuit comprising:
        a cascode transistor electrically coupled with the erase gate;
        a ground transistor electrically coupled between the cascode transistor and ground; and
        a switch electrically coupled between the erase gate and a latch.

2. The method of claim 1, wherein the fourth voltage level is higher than the second voltage level and lower than the first voltage level.

3. The method of claim 1, wherein the third voltage level is lower than the second voltage level.

4. The method of claim 1, further comprising:
    before electrically floating the erase gate, pulling a voltage level of the erase gate toward 0V.

5. The method of claim 1, further comprising:
    applying a fifth voltage level to the control gate;
    applying a sixth voltage level to the wall line;
    applying a seventh voltage level to the first S/D region;
    applying an eighth voltage level to the second S/D region; and
    electrically floating the erase gate.

6. The method of claim 5, wherein the fifth voltage level is substantially equal to the sixth voltage level and the seventh voltage level is higher than the eighth voltage level.

7. The method of claim 6, wherein the fifth voltage level is higher than the seventh voltage level.

8. The method of claim 1, further comprising:
    applying a ninth voltage level to the control gate;
    applying a tenth voltage level to the wall line;
    applying an eleventh voltage level to the first S/D region;
    applying a twelfth voltage level to the second S/D region; and
    applying a thirteenth voltage level to the erase gate, wherein the thirteenth voltage level is higher than each of the ninth voltage level, the tenth voltage level, the eleventh voltage level, and the twelfth voltage.

9. The method of claim 8, wherein the tenth voltage level, the eleventh voltage level and the twelfth voltage level have the substantially same voltage level.

10. The method of claim 9, wherein the ninth voltage level is higher than the tenth voltage level.

11. The method of claim 1, wherein applying the third voltage level to the first S/D region comprises applying a voltage level equal to 0.8±0.1V.

12. A method of operating a FLASH memory cell, the FLASH memory cell comprising a floating gate being disposed over a substrate, a control gate being disposed over the floating gate, a wall line being disposed adjacent to a first sidewall of the control gate, an erase gate being disposed adjacent to a second sidewall of the control gate, a first source/drain (S/D) region being disposed in the substrate and adjacent to a sidewall of the wall line, and a second S/D region being disposed in the substrate and adjacent to the a sidewall of the floating gate, the method comprising:
    applying a first voltage level to the control gate;
    applying a second voltage level to the wall line, wherein the second voltage level is lower than the first voltage level;

applying a third voltage level to the first S/D region, wherein the third voltage level is greater than a ground voltage and lower than the second voltage level;

applying a fourth voltage level to the second S/D region, wherein the fourth voltage level is higher than the third voltage level, the fourth voltage level is higher than the second voltage level and lower than the first voltage level;

pulling a voltage level of the erase gate toward 0 V; and electrically floating the erase gate using an erase gate decoding circuit, the erase gate decoding circuit comprising:
- a cascode transistor electrically coupled with the erase gate;
- a ground transistor electrically coupled between the cascode transistor and ground; and
- a switch electrically coupled between the erase gate and a latch.

13. The method of claim 12, further comprising:
applying a fifth voltage level to the control gate;
applying a sixth voltage level to the wall line;
applying a seventh voltage level to the first S/D region;
applying an eighth voltage level to the second S/D region; and
electrically floating the erase gate.

14. The method of claim 13, wherein the fifth voltage level is substantially equal to the sixth voltage level and the seventh voltage level is higher than the eighth voltage level.

15. The method of claim 14, wherein the fifth voltage level is higher than the seventh voltage level.

16. The method of claim 12, further comprising:
applying a ninth voltage level to the control gate;
applying a tenth voltage level to the wall line;
applying an eleventh voltage level to the first S/D region;
applying a twelfth voltage level to the second S/D region; and
applying a thirteenth voltage level to the erase gate, wherein the thirteenth voltage level is higher than each of the ninth voltage level, the tenth voltage level, the eleventh voltage level, and the twelfth voltage.

17. The method of claim 16, wherein the tenth voltage level, the eleventh voltage level, the twelfth voltage level have the substantially same voltage level and the ninth voltage level is higher than the tenth voltage level.

18. A FLASH memory circuit comprising:
at least one FLASH memory array comprising a plurality of FLASH memory cells, the FLASH memory cells comprising a first FLASH memory cell comprising a floating gate being disposed over a substrate, a control gate being disposed over the floating gate, a wall line being disposed adjacent to a first sidewall of the control gate, an erase gate being disposed adjacent to a second sidewall of the control gate, a first source/drain (S/D) region being disposed in the substrate and adjacent to a sidewall of the wall line, and a second S/D region being disposed in the substrate and adjacent to a sidewall of the floating gate; and an erase gate decoding circuit electrically coupled with the first FLASH memory cell, wherein the erase gate decoding circuit is configured to electrically float the erase gate while the first FLASH memory cell is programmed, wherein the erase gate decoding circuit comprises:
- a cascode transistor electrically coupled with the erase gate;
- a ground transistor electrically coupled between the cascode transistor and ground; and
- a switch electrically coupled between the erase gate and a latch.

19. The FLASH memory circuit of claim 18, wherein the erase gate decoding circuit is configured to electrically float the erase gate while the first FLASH memory cell is read.

20. The FLASH memory circuit of claim 18, wherein the switch is configured to electrically isolate the latch and the erase gate during a discharge period before programming the first FLASH memory cell, and the ground transistor is configured to pull a voltage level on the erase gate toward ground during the discharge period.

* * * * *